(12) United States Patent
Tang et al.

(10) Patent No.: US 11,372,499 B2
(45) Date of Patent: Jun. 28, 2022

(54) TOUCH DISPLAY PANEL AND TOUCH DISPLAY DEVICE

(71) Applicant: Wuhan China Star Optoelectronics Technology Co., Ltd., Hubei (CN)

(72) Inventors: Yuejun Tang, Hubei (CN); Xueyun Li, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 310 days.

(21) Appl. No.: 16/604,274

(22) PCT Filed: Mar. 6, 2019

(86) PCT No.: PCT/CN2019/077155
§ 371 (c)(1),
(2) Date: Oct. 10, 2019

(87) PCT Pub. No.: WO2020/107740
PCT Pub. Date: Jun. 4, 2020

(65) Prior Publication Data
US 2021/0357051 A1 Nov. 18, 2021

(30) Foreign Application Priority Data
Nov. 30, 2018 (CN) .......................... 201811458581.8

(51) Int. Cl.
*G06F 3/041* (2006.01)
*H01L 51/52* (2006.01)
*H01L 27/32* (2006.01)

(52) U.S. Cl.
CPC ........ *G06F 3/04164* (2019.05); *G06F 3/0412* (2013.01); *H01L 27/323* (2013.01); *H01L 51/5253* (2013.01)

(58) Field of Classification Search
CPC .... G06F 3/0412; G06F 3/04164; G06F 3/041; G06F 3/03; G06F 3/01; G06F 3/00;
(Continued)

(56) References Cited

U.S. PATENT DOCUMENTS

| 7,667,395 B2* | 2/2010 | Hayashi | ............... H01L 51/5253 313/512 |
| 2006/0158111 A1* | 7/2006 | Hayashi | ............... H01L 51/5253 313/512 |

(Continued)

FOREIGN PATENT DOCUMENTS

| CN | 206301307 U | 7/2017 |
| CN | 107168581 A | 9/2017 |

(Continued)

*Primary Examiner* — Julie Anne Watko
(74) *Attorney, Agent, or Firm* — Taft Stettinius & Hollister LLP

(57) ABSTRACT

A touch display panel and a touch display device including an array substrate, a light-emitting layer, an encapsulation layer, and a touch function layer are provided. The array substrate includes a first trace. The touch function layer includes a second trace. The second trace is electrically connected to the chip by a bonding end, in which the chip is integrated with functions of display control and touching control. This realizes a control of a display function and a touch function of the touch display panel or the touch display device, thereby reducing the number of chips. At the same time, the stepped structure of the edge of the encapsulation layer effectively alleviates the steep gradient between the touch function layer and the array substrate, thereby facilitating the electrical connection of the trace on the touch function layer to the trace on the array substrate.

16 Claims, 3 Drawing Sheets

(58) Field of Classification Search
CPC .............. H01L 27/323; H01L 27/3244; H01L 51/5253; H01L 27/3225; H01L 27/32; H01L 27/28; H01L 27/00; H01L 51/5256; H01L 51/5237; H01L 51/52; H01L 51/50; H01L 51/00; H01L 27/3297; H01L 27/3276; H01L 27/3241
See application file for complete search history.

(56) References Cited

U.S. PATENT DOCUMENTS

| | | | | |
|---|---|---|---|---|
| 2017/0344165 | A1* | 11/2017 | Heo | G06F 3/0447 |
| 2018/0046301 | A1* | 2/2018 | Zhou | G06F 3/0443 |
| 2018/0053810 | A1* | 2/2018 | Jin | G06F 3/04164 |
| 2018/0182817 | A1* | 6/2018 | Jo | H01L 27/3246 |
| 2019/0035860 | A1* | 1/2019 | Oh | H01L 27/3246 |
| 2021/0336208 | A1* | 10/2021 | Liu | H01L 51/5293 |

FOREIGN PATENT DOCUMENTS

| | | | |
|---|---|---|---|
| CN | 107579081 A | * | 1/2018 |
| CN | 107783690 A | | 3/2018 |
| CN | 108258009 A | | 7/2018 |
| JP | 2016212567 A | | 12/2016 |

\* cited by examiner

TOUCH DISPLAY PANEL AND TOUCH DISPLAY DEVICE

CROSS-REFERENCE TO RELATED APPLICATIONS

This application is a U.S. National Phase of International PCT Application No. PCT/CN2019/077155 filed Mar. 6, 2019, which claims the benefit of Chinese Patent Application Serial No. 201811458581.8 filed Nov. 30, 2018, the contents of each application are incorporated herein by reference in their entirety.

FIELD OF INVENTION

The present invention relates to the field of display technologies, and in particular, to a touch display panel and a touch display device.

BACKGROUND OF INVENTION

At present, touch technology has been widely used in various displays. There are many ways to arrange touch technology in the display. Among them, the external touch is a type that has more applications. The external touch control is to make a touch function layer on an outer surface of an encapsulation layer after completing the display encapsulation, and then the touch function layer is electrically connected to a touch control chip through a flexible circuit board. Therefore, a bonding terminal of the touch function layer should be disposed at a position of an edge of the encapsulation layer, and is electrically connected to the touch control chip through the flexible circuit board.

In the external touch display device, the touch function and the display function generally need to be controlled by different chips, resulting in the problem of using a large number of chips.

Technical Problem

In the external touch display device, the touch function and the display function generally need to be controlled by different chips, resulting in the problem of using a large number of chips. In order to solve this problem, it is proposed to directly connect the control end of the touch function and the control end of the display function with each other. However, such a proposal is structurally difficult to carry out.

Technical Solution

In order to solve the above mentioned technical problems, the solution provided by the present invention is as follows:

The present invention provides a touch display panel comprising:

An array substrate includes a first trace;

A light-emitting layer disposed on the array substrate;

An encapsulation layer disposed on the light-emitting layer to cover the light-emitting layer; and A touch function layer disposed on the encapsulation layer;

The touch function layer includes a second trace, the second trace electrically connects with the first trace along an edge of the encapsulation layer, a connection end is formed at a connection of the first trace and the second trace, and an edge of the encapsulation layer corresponding to the second trace is a stepped structure.

In the touch display panel of the present invention, the encapsulation layer includes an organic layer and an inorganic layer, and the stepped structure is formed by a slope structure of an edge of the organic layer.

In the touch display panel of the present invention, the encapsulation layer includes an alternating arrangement of a plurality of organic layers and a plurality of inorganic layers, and the stepped structure is formed by slope structures of edges of the organic layers.

In the touch display panel of the present invention, in the organic layers, slope surfaces of the slope structures of the edges of the organic layers are in the same plane to form a stepped structure having a single step.

In the touch display panel of the present invention, in the organic layers, the slope surfaces of the slope structures of the edges of the organic layers are in different planes to form a stepped structure having multiple steps.

In the touch display panel of the present invention, in the organic layers, a length of a lower organic layer is greater than a length of an adjacent upper organic layer to form a platform between the two adjacent organic layers.

In the touch display panel of the present invention, in the organic layers, one or two or more adjacent layers of the organic layers are defined as a group, and the slope surfaces of the slope structures of the edges of the organic layers in each group are in the same plane, and the slope surfaces of the slope structures of the edges of different groups are in different planes to form a stepped structure having multiple steps.

In the touch display panel of the present invention, a length of the organic layer in the lower layer is greater than a length of the organic layer in an adjacent upper layer to form a platform between two adjacent groups.

In the touch display panel of the present invention, the inorganic layer completely covers the organic layer and the slope structure of the edge of the organic layer.

In the touch display panel of the present invention, the material of the inorganic layer is selected from one or more of silicon nitride, aluminum nitride, zirconium nitride, titanium nitride, tantalum nitride, tantalum nitride, silicon oxide, aluminum oxide, titanium oxide, tin oxide, antimony oxide, and silicon oxynitride.

In the touch display panel of the present invention, the material of the organic layer is selected from one or more of polymethyl methacrylate, phenol-based polymeric derivative, propylene-based polymer, imino polymer, aryl ether-based polymer, amide-based polymer, fluorine-based polymer, p-xylylene polymer, and vinyl alcohol group polymer.

In the touch display panel of the present invention, the array substrate further includes a bonding end electrically connected to a chip integrated with functions of display control and touching control.

In the touch display panel of the present invention, the connection end is electrically connected to the bonding end.

In the touch display panel of the present invention, the connection end is parallel to the bonding end.

In the touch display panel of the present invention, the connection end is composed of two segments respectively located at two sides of an end of the bonding end.

In the touch display panel of the present invention, the connecting end is composed of a section located at a side of the bonding end.

In the touch display panel of the present invention, the connection end is perpendicular to the bonding end.

In the touch display panel of the present invention, the connecting end includes two segments perpendicular to each other, and the two segments of the connecting end are parallel to and perpendicular to the bonding end respectively.

In order to achieve the above objectives, a touch display device comprising the touch display panel as mentioned above is further provided.

Beneficial Effect

The technical solution provided by the present invention makes a trace of a touch function layer electrically connected to a trace on an array substrate along a stepped structure disposed on the edge of the encapsulation layer. The trace of the touch function layer is then electrically connected to the chip integrated with functions of display control and touch control through a bonding end. The technical solution realizes the control of the display function and the touch function of the touch display panel or the touch display device, thereby reducing the number of chips. At the same time, the stepped structure of the edge of the encapsulation layer effectively alleviates the steep gradient between the touch function layer and the array substrate, thereby facilitating the electrical connection of the traces on the touch function layer to the traces on the array substrate.

DESCRIPTION OF DRAWINGS

In order to more clearly illustrate the technical solutions of the embodiments or the prior art, the drawings used in the embodiments or the prior art description will be briefly described below. Obviously, the drawings in the following description are merely for the present invention. Some embodiments of the present invention can also be obtained by other drawings according to these drawings without any creative work for those skilled in the art.

DETAILED DESCRIPTION OF PREFERRED EMBODIMENTS

Figure 1:
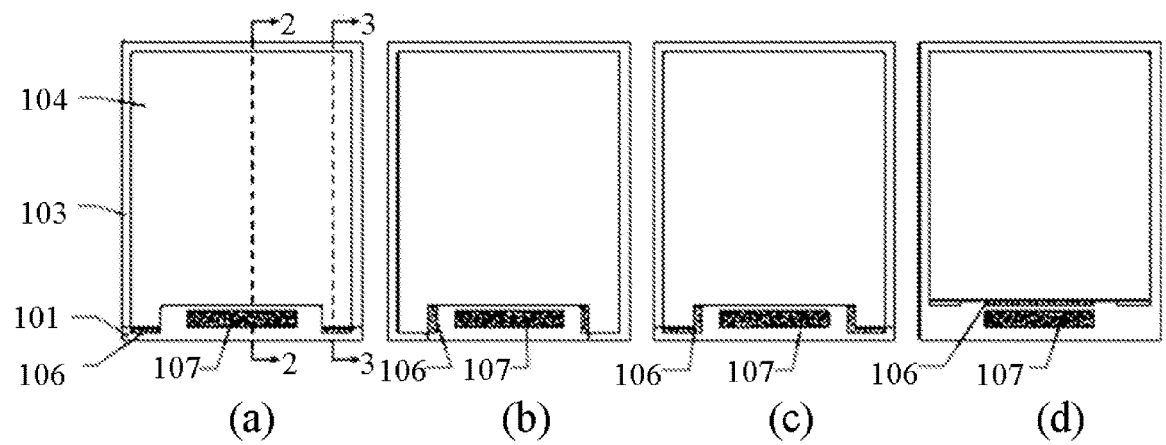
FIGS. 1a-1d re schematic views of a touch display panel according to an embodiment of the present invention.

The following description of the various embodiments is provided with reference to the accompanying drawings. Directional terms mentioned in this application, such as [upper], [lower], [previous], [post], [left], [right], [inside], [outside], [side], etc., only reference the direction of the drawing. Therefore, the directional terms are used for the purpose of explaining and understanding the present invention, and is not intended to limit the present invention. In the drawings, units with similar structure are denoted by the same reference numerals.

The First Embodiment

A touch display panel including an array substrate, a light-emitting layer, an encapsulation layer and a touch function layer is provided. A trace of the touch function layer is electrically connected to a trace of the array substrate along a stepped structure of an edge of the encapsulation layer, and is then electrically connected to the chip by a bonding end, in which the chip is integrated with functions of display control and touching control. This realizes the control of the display function and the touch function, thereby reducing the number of chips. At the same time, the stepped structure of the edge of the encapsulation layer effectively alleviates the steep gradient between the touch function layer and the array substrate, thereby facilitating the electrical connection of the traces on the touch function layer to the traces on the array substrate.

The touch display panel provided in this embodiment is specifically described below with reference to the accompanying drawings.

Figure 2:
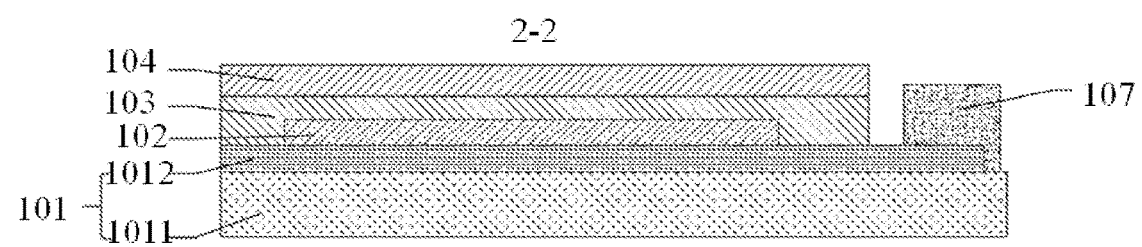
FIG. 2 is a cross-sectional view of the touch display panel taken along line 2-2 of FIG. 1.
Figure 3:
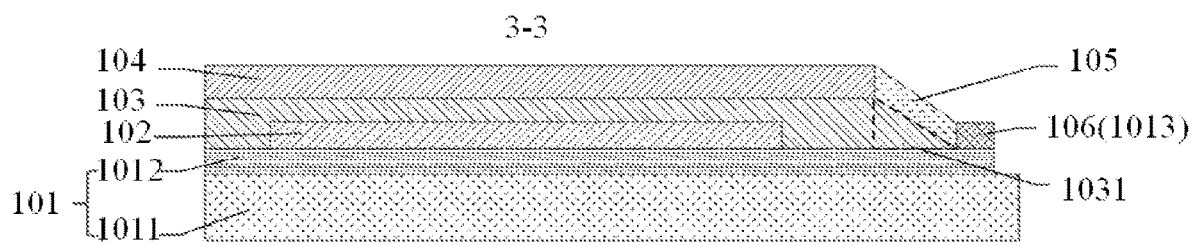
FIG. 3 is a cross-sectional view of the touch display panel taken along line 3-3 of FIG. 1.

FIGS. 1-3 are schematic views showing the overall structure of the touch display panel. FIGS. 1a-1d illustrate a connection end 106 formed by a trace disposed on the touch function layer 104 and a trace disposed on the array substrate 101; the connection end 106 is, for example, a line or a soldering surface composed of a plurality of solder joints; FIGS. 1a-1d show four different positional relationships between the connection end 106 and the bonding end 107 disposed on the array substrate 101. The connection ends 106 of FIGS. 1a-1d are located on two sides of two ends of the bonding end 107. The connection end 106 of FIG. 1a is parallel to the bonding end 107. The connection end 106 of FIG. 1b is perpendicular to the bonding end 107. As shown in FIG. 1c, the connecting ends 106 each have two segments perpendicular to each other, and the segments are parallel and perpendicular to the bonding end 107. The connecting end 106 of FIG. 1d is located at the side of the bonding end 107 and parallel to the bonding end 107. It should be noted that the four positional relationships between the connection end 106 and the bonding end 107 can be freely selected according to the arrangements of the internal devices of the display panel.

FIGS. 2 and 3 are cross-sectional views taken along lines 2-2 and 3-3, respectively. The touch display panel provided in this embodiment is specifically described below with reference to FIG. 1 to FIG. 3

The touch display panel provided in this embodiment includes an array substrate 101, a light-emitting layer 102, an encapsulation layer 103, and a touch function layer 104, which are sequentially disposed. The array substrate 101 is composed of a substrate 1011 and an array layer 1012 disposed on the substrate 1011. The array layer 1012 at least includes an array of switching transistors, a driving transistor, a compensation circuit, and one or more capacitors. The array substrate 101 further includes a first trace 1013 (a portion of the first trace 1013 is overlapped with the connection end 106). The light-emitting layer 102 is disposed on the array substrate 101, and includes an anode, a luminescent material layer, and a cathode. The encapsulation layer 103 covers the light-emitting layer 102 and the array substrate 101. The touch function layer 104 is disposed on the encapsulation layer 103, and the touch function layer 104 includes a second trace 105. The second trace 105 is electrically connected to the first trace 1013 along an edge 1031 of the encapsulation layer 103. The connection between the first trace 1013 and the second trace 105 forms a connection end 106. The edge 1031 of the encapsulation layer 103, which corresponds to the second trace 105, is a stepped structure.

Several ways of forming the stepped structure of the edge 1031 of the encapsulation layer will be respectively described below with reference to FIG. 4 to FIG. 7.

Figure 4:
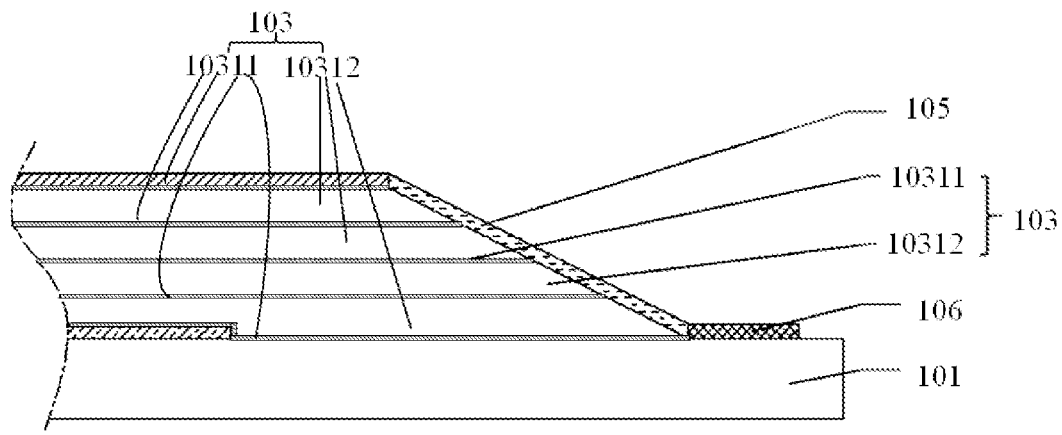
FIG. 4 to FIG. 7 are schematic views of the touch display panel including a stepped structure of an edge of an encapsulation layer according to the first embodiment of the present invention.

As shown in FIGS. 3 and 4, the encapsulation layer 103 is composed of a plurality of inorganic layers 10311 and a plurality of organic layers 10312. The inorganic layers 10311 and the organic layers 10312 are alternately arranged.

Preferably, the innermost layer and the outermost layer of the encapsulation layer 103 are both inorganic layers 10311. A thickness of a single layer of the organic layers 10312 is much larger than a thickness of a single layer of the inorganic layers 10311. The edges of the organic layers 10312 are slope structures, and the slope surfaces of the slope structures of the layers are all in the same plane, thereby forming a stepped structure having a single step. The second trace 105 of the touch function layer is electrically connected to the first trace 1013 disposed on the array substrate 101 along the stepped structure (as shown in FIG. 3). The connection between the first trace 1013 and the second trace 105 forms a connection end 106. The stepped structure effectively alleviates the steep gradient between the touch function layer and the array substrate, thereby facilitating the electrical connection of the trace on the touch function layer to the trace on the array substrate.

The connection end 106 is electrically connected to the chip integrated with functions of display control and touching control through the bonding end 107 (as shown in FIG. 1), thereby realizing the control of the display function and the touch function of the touch display panel. There is no need to set the touch control chip separately, and thus reducing the number of chips.

Figure 5:
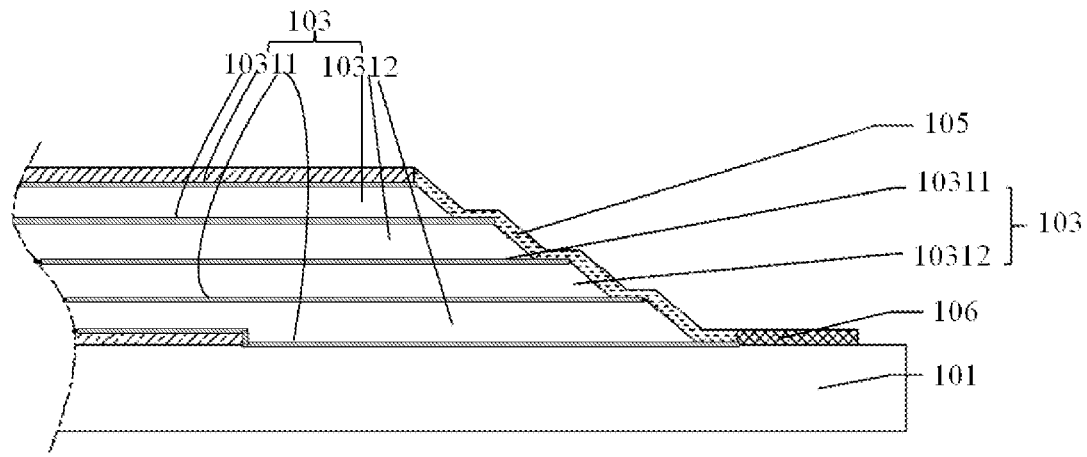

As shown in FIG. 5, the encapsulation layer 103 is composed of a plurality of inorganic layers 10311 and a plurality of organic layers 10312. The inorganic layers 10311 and the organic layers 10312 are alternately arranged. Preferably, the innermost layer and the outermost layer of the encapsulation layer 103 are both inorganic layers 10311, and thickness of a single layer of the organic layers 10312 is much larger than a thickness of a single layer of the inorganic layers 10311. The edge of the organic layer 10312 is a slope structure. The slope surfaces of the slope structures of the layers are in different planes, and a length of the organic layer 10312 of a lower layer is greater than a length of the organic layer 10312 of an adjacent upper layer, and a platform is formed at the inorganic layer 10311 to form a stepped structure having multiple steps. The second trace 105 of the touch function layer is electrically connected to the first trace 1013 disposed on the array substrate 101 along the stepped structure (as shown in FIG. 3). A connection end 106 is formed at the connection of the first trace 1013 and the second trace 105. The stepped structure effectively alleviates the steep gradient between the touch function layer and the array substrate, thereby facilitating the electrical conduction of the traces on the touch function layer to the traces on the array substrate.

The connection end 106 is electrically connected to the chip integrated with functions of display control and touching control through the bonding end 107 (as shown in FIG. 1), thereby realizing the control of the display function and touch function of the touch display panel through the same chip. There is no need to set the touch control chip separately, and thus reducing the number of chips.

Figure 6:
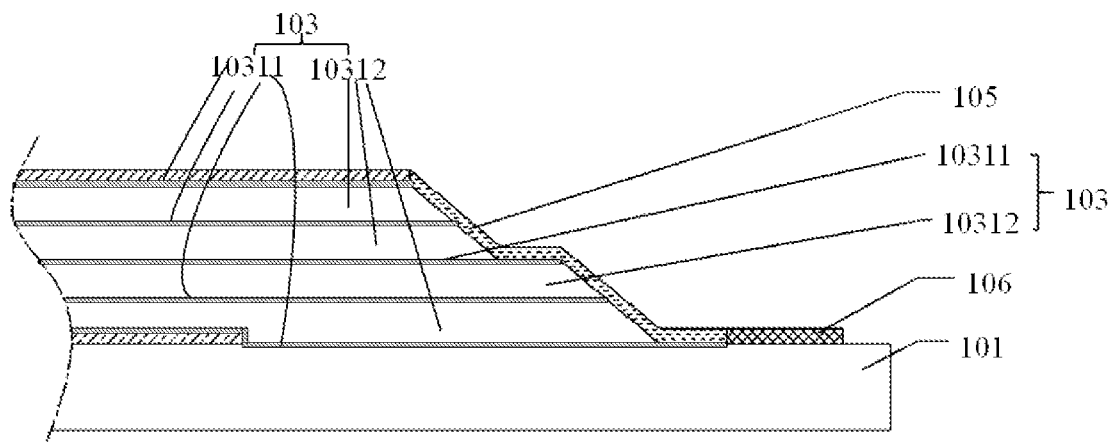

As shown in FIG. 6, the encapsulation layer 103 is composed of a plurality of inorganic layers 10311 and a plurality of organic layers 10312, and the inorganic layers 10311 and the organic layers 10312 are alternately arranged. Preferably, the innermost layer and the outermost layer of the encapsulation layer 103 are both inorganic layers 10311, and thickness of a single layer of the organic layers 10312 is much larger than a thickness of a single layer of the inorganic layers 10311. The edges of the organic layers 10312 are slope structures, two adjacent layers of the organic layers 10312 are defined as a group. The slope surfaces of the slope structures of the edges of the organic layers in each group are in the same plane, and the slope surfaces of the slope structures of the edges of different groups are in different planes. A length of the organic layer in the lower layer is greater than a length of the organic layer in an adjacent upper layer to form a platform at the inorganic layer 10311 between two adjacent groups. The second trace 105 of the touch function layer is electrically connected to the first trace 1013 disposed on the array substrate 101 along the stepped structure (as shown in FIG. 3). The connection between the first trace 1013 and the second trace 105 forms a connection end 106. The stepped structure effectively alleviates the steep gradient between the touch function layer and the array substrate, thereby facilitating the electrical connection of the trace on the touch function layer to the trace on the array substrate.

The connection end 106 is electrically connected to the chip integrated with functions of display control and touching control through the bonding end 107 (as shown in FIG. 1), thereby realizing the control of the display function and touch function of the touch display panel through the same chip. There is no need to set the touch control chip separately, and thus reducing the number of chips.

Figure 7:
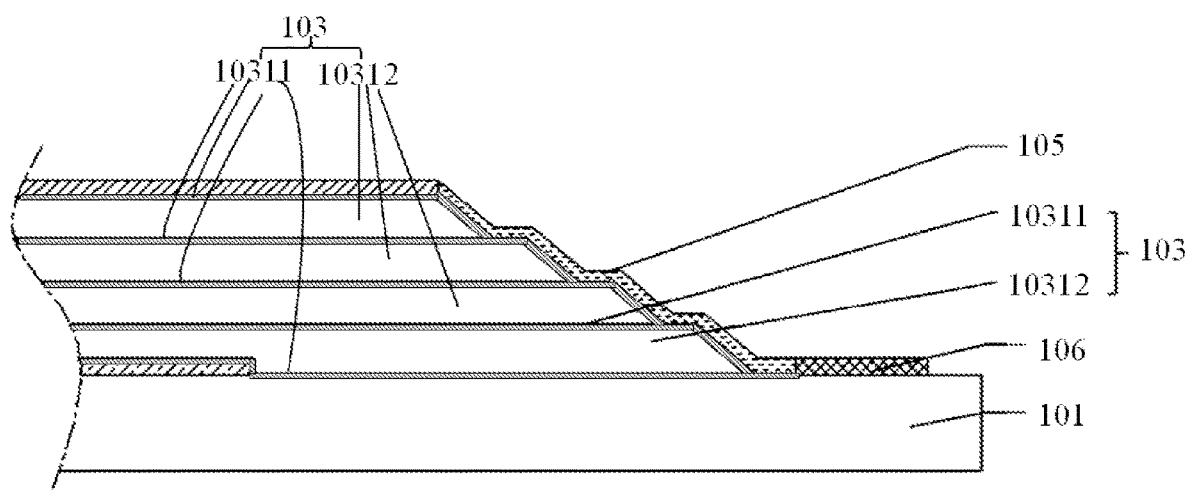

As shown in FIG. 7, the encapsulation layer 103 is composed of a plurality of inorganic layers 10311 and a plurality of organic layers 10312, and the inorganic layers 10311 and the organic layers 10312 are alternately arranged. Preferably, the innermost layer and the outermost layer of the encapsulation layer 103 are both inorganic layers 10311, and thickness of a single layer of the organic layers 10312 is much larger than a thickness of a single layer of the inorganic layers 10311. The edges of the organic layers 10312 are slope structures, and the slope surfaces of the slope structures of the edges of the organic layers are in different planes. A length of the organic layer 10312 in the lower layer is greater than a length of the organic layer 10312 in an adjacent upper layer to form a platform at the inorganic layer 10311. The inorganic layers 10311 completely cover the organic layers 10312 and the slope structures of the edges thereof, and thus forms a stepped structure having multiple steps. The second trace 105 of the touch function layer is electrically connected to the first trace 1013 disposed on the array substrate 101 along the stepped structure (as shown in FIG. 3). The connection between the first trace 1013 and the second trace 105 forms a connection end 106. The stepped structure effectively alleviates the steep gradient between the touch function layer and the array substrate, thereby facilitating the electrical connection of the trace on the touch function layer to the trace on the array substrate.

The connection end 106 is electrically connected to the chip integrated with functions of display control and touching control through the bonding end 107 (as shown in FIG. 1), thereby realizing the control of the display function and touch function of the touch display panel through the same chip. There is no need to set the touch control chip separately, and thus reducing the number of chips.

Although the embodiments of FIGS. 4 to 7 show the designs of four stepped structures, they are not limited to the four stepped structure designs, and may be a combination design of any two or more stepped structures in FIGS. 4 to 7. For example, from the inner layer to the outer layer of the encapsulation layer, the first organic layer is the first group, the second organic layer and the third organic layer are the second group, and the remaining organic layers are alternately arranged in a manner similar to the first group and the second group to form a plurality of groups. The slope surfaces of the slope structures of the organic layers in each group are in the same plane, the slope surfaces of the slope structures of the organic layers of different groups are in different planes. The lengths of the organic layers in the lower layer group are larger than the lengths of the organic layers in the adjacent upper layer group. A platform is formed at the inorganic layer between two adjacent groups, thereby forming a stepped structure having multiple steps.

In the embodiment of the present invention, the material of the inorganic layer is selected from one or more of silicon nitride, aluminum nitride, zirconium nitride, titanium nitride, tantalum nitride, tantalum nitride, silicon oxide, aluminum oxide, titanium oxide, tin oxide, antimony oxide, and silicon oxynitride.

The Second Embodiment

This embodiment provides a touch display device including the touch display panel according to the first embodiment.

The touch display device may be an electroluminescent display device, such as an electronic paper, a mobile phone, a tablet computer, a television, a display, a laptop, a digital photo frame, a navigator, or the like, or any product or component having a touch display function. The touch display device of the present embodiment has the structural advantages of the touch display panel according to the first embodiment. That is, the trace of the touch function layer of the touch display device is electrically connected to the trace on the array substrate along the stepped structure disposed on the edge of the encapsulation layer, and then electrically connected to the chip integrated with functions of display control and touch control through the bonding end, thereby realizing the control of the display function and touch function of the touch display panel through the same chip. There is no need to set the touch control chip separately, and thus reducing the number of chips. Also, the stepped structure of the edge of the encapsulation layer effectively alleviates the steep gradient between the touch function layer and the array substrate, thereby facilitating the electrical connection of the trace on the touch function layer to the trace on the array substrate.

Although the present invention has been described with specific embodiments, but are not intended to limit the present invention. Any person skilled in the art, without departing from the spirit and scope of the present invention, can be made a number of modifications and variations of the present invention. Thus, the scope of protection of this application is subject to the scope defined by the claims.

What is claimed is:

1. A touch display panel, comprising:
   an array substrate comprising a first trace and a bonding end, wherein the bonding end is electrically connected to a chip integrated with functions of display control and touch control;
   a light-emitting layer disposed on the array substrate;
   an encapsulation layer disposed on the light-emitting layer and covering the light-emitting layer; and
   a touch function layer disposed on the encapsulation layer;
   wherein the touch function layer comprises a second trace, the second trace extends along an edge of the encapsulation layer to electrically connect with the first trace, a connection end is formed at a connection of the first trace and the second trace, the edge of the encapsulation layer corresponding to the second trace is a stepped structure, and the connection end is electrically connected to the bonding end; and
   wherein the connection end is parallel to or perpendicular to the bonding end.

2. The touch display panel as claimed in claim 1, wherein the encapsulation layer comprises an organic layer and an inorganic layer, and the stepped structure is formed by a slope structure of an edge of the organic layer.

3. The touch display panel as claimed in claim 2, wherein the inorganic layer completely covers the organic layer and the slope structure of the edge of the organic layer.

4. The touch display panel as claimed in claim 2, wherein a material of the inorganic layer is selected from one or more of silicon nitride, aluminum nitride, zirconium nitride, titanium nitride, tantalum nitride, silicon oxide, aluminum oxide, titanium oxide, tin oxide, antimony oxide, and silicon oxynitride.

5. The touch display panel as claimed in claim 2, wherein a material of the organic layer is selected from one or more of polymethyl methacrylate, phenol-based polymeric derivative, propylene-based polymer, imino polymer, aryl ether-based polymer, amide-based polymer, fluorine-based polymer, p-xylylene polymer, and vinyl alcohol group polymer.

6. The touch display panel as claimed in claim 1, wherein the encapsulation layer comprises an alternating arrangement of a plurality of organic layers and a plurality of inorganic layers, and the stepped structure is formed by slope structures of edges of the organic layers.

7. The touch display panel as claimed in claim 6, wherein in the organic layers, slope surfaces of the slope structures of the edges of the organic layers are in a same plane, and the stepped structure has a single step.

8. The touch display panel as claimed in claim 6, wherein in the organic layers, slope surfaces of the slope structures of the edges of the organic layers are in different planes, and the stepped structure has multiple steps.

9. The touch display panel as claimed in claim 8, wherein in the organic layers, a length of a lower organic layer is greater than a length of an adjacent upper organic layer to form a platform between the lower organic layer and the adjacent upper organic layer.

10. The touch display panel as claimed in claim 6, wherein the encapsulation layer is defined by a plurality of groups of the organic layers, each group comprises two or more adjacent layers of the organic layers, and slope surfaces of the slope structures of the edges of the organic layers in each group are in a same plane, and the slope surfaces of the slope structures of the edges of the organic layers in different groups are in different planes, and the stepped structure has multiple steps.

11. The touch display panel as claimed in claim 10, wherein a length of the organic layers in a lower group is greater than a length of the organic layers in an adjacent upper group to form a platform between two adjacent groups.

12. The touch display panel as claimed in claim 6, wherein the inorganic layers completely cover the organic layers and the slope structures of the edges of the organic layers.

13. The touch display panel as claimed in claim 1, wherein the connection end is composed of two segments respectively located at two ends of the bonding end.

14. The touch display panel as claimed in claim 1, wherein the connecting end is composed of a section located at a side of the bonding end.

15. The touch display panel as claimed in claim 1, wherein the connecting end comprises two segments perpendicular to each other, and the two segments of the connecting end are parallel to and perpendicular to the bonding end, respectively.

16. A touch display device, comprising the touch display panel as claimed in claim 1.

\* \* \* \* \*